(12) United States Patent
Ahn

(10) Patent No.: US 6,410,976 B1
(45) Date of Patent: Jun. 25, 2002

(54) INTEGRATED CIRCUITRY HAVING CONDUCTIVE PASSAGEWAY INTERCONNECTING CIRCUITRY ON FRONT AND BACK SURFACES OF A WAFER FRAGMENT

(75) Inventor: Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/659,868

(22) Filed: Sep. 12, 2000

Related U.S. Application Data

(62) Division of application No. 08/917,443, filed on Aug. 22, 1997, now Pat. No. 6,187,677.

(51) Int. Cl.$^7$ .............................................. H01L 29/40
(52) U.S. Cl. ...................... 257/621; 257/698; 257/700
(58) Field of Search ................................ 257/621, 698, 257/700, 686, 739, 773, 714, 774

(56) References Cited

U.S. PATENT DOCUMENTS

| | | | |
|---|---|---|---|
| 3,982,268 A | 9/1976 | Anthony et al. | 357/55 |
| 4,394,712 A | 7/1983 | Anthony | 361/411 |
| 4,419,150 A | 12/1983 | Soclof | 148/187 |

(List continued on next page.)

FOREIGN PATENT DOCUMENTS

| | | |
|---|---|---|
| JP | 4-133472 | 7/1992 |

OTHER PUBLICATIONS

Takayjki Ohba et al., Selective Chemical Vapor Deposition of Tungsten Using Silane and Plysilane Reductions, Materials Research Society, pp. 17–25 (1989).

(List continued on next page.)

*Primary Examiner*—Caridad Everhart
(74) *Attorney, Agent, or Firm*—Wells St. John P.S.

(57) ABSTRACT

Integrated circuitry and methods of forming integrated circuitry are described. In one aspect, a hole is formed in a semiconductor wafer. In a preferred implementation, the hole extends through the entire wafer. Subsequently, conductive material is formed within the hole and interconnects with integrated circuitry which is formed proximate at least one of a front and back wafer surface. According to one aspect of the invention, integrated circuitry is formed proximate both front and back surfaces. In a preferred implementation, a plurality of holes are formed through the wafer prior to formation of the integrated circuitry. In accordance with a preferred implementation, formation of the conductive material within the hole takes place through formation of a first material within the hole. A second material is formed over the first material, with at least the second material being electrically conductive. The wafer is exposed to conditions which are effective to cause the second material to replace the first material. In another preferred implementation, the hole has an interior surface and prior to formation of the conductive material therein, a dielectric layer is formed within the hole proximate the interior surface.

4 Claims, 4 Drawing Sheets

U.S. PATENT DOCUMENTS

| | | | |
|---|---|---|---|
| 4,440,973 A | 4/1984 | Hawkins | 174/107 |
| 4,595,428 A | 6/1986 | Anthony et al. | 148/187 |
| 4,610,077 A | 9/1986 | Minahan et al. | 29/572 |
| 4,776,087 A | 10/1988 | Cronin et al. | 29/828 |
| 4,870,470 A | 9/1989 | Bass, Jr. et al. | 357/23.5 |
| 4,933,743 A | 6/1990 | Thomas et al. | 357/71 |
| 4,939,568 A | 7/1990 | Kato et al. | 357/75 |
| 4,977,439 A | 12/1990 | Esquivel et al. | 357/49 |
| 5,148,260 A | 9/1992 | Inoue et al. | 357/67 |
| 5,166,097 A | 11/1992 | Tanielian | 437/203 |
| 5,312,765 A | 5/1994 | Kanber | 437/22 |
| 5,317,197 A | 5/1994 | Roberts | 257/401 |
| 5,424,245 A | 6/1995 | Gurtler et al. | 437/183 |
| 5,426,072 A | 6/1995 | Finnila | 437/208 |
| 5,482,873 A | 1/1996 | Yang | 437/31 |
| 5,528,080 A * | 6/1996 | Goldstein | |
| 5,539,227 A | 7/1996 | Nakano | 257/276 |
| 5,539,256 A | 7/1996 | Mikagi | 257/763 |
| 5,587,119 A | 12/1996 | White | 264/104 |
| 5,596,230 A | 1/1997 | Hong | 257/758 |
| 5,599,744 A | 2/1997 | Koh et al. | 437/195 |
| 5,608,237 A | 3/1997 | Aizawa et al. | 257/132 |
| 5,614,743 A | 3/1997 | Mochizuki | 257/276 |
| 5,618,752 A | 4/1997 | Gaul | 438/626 |
| 5,635,423 A | 6/1997 | Huang et al. | 437/195 |
| 5,640,049 A | 6/1997 | Rostoker et al. | 257/758 |
| 5,646,067 A | 7/1997 | Gaul | 437/180 |
| 5,661,344 A | 8/1997 | Havemann et al. | 257/758 |
| 5,682,062 A | 10/1997 | Gaul | 257/686 |
| 5,698,867 A | 12/1997 | Bauer et al. | 257/138 |
| 5,699,291 A | 12/1997 | Tsunemine | 365/149 |
| 5,717,247 A | 2/1998 | Koh et al. | 257/686 |
| 5,750,436 A | 5/1998 | Yamaga et al. | 438/558 |
| 5,753,529 A | 5/1998 | Chang et al. | 437/67 |
| 5,767,001 A | 6/1998 | Bertagnolli et al. | 438/455 |
| 5,807,783 A | 9/1998 | Gaul et al. | 438/406 |
| 5,811,868 A | 9/1998 | Bertin et al. | 257/516 |
| 5,817,572 A | 10/1998 | Chiang et al. | 438/624 |
| 5,827,775 A | 10/1998 | Miles et al. | 438/622 |
| 5,841,197 A | 11/1998 | Adamic, Jr. | 257/777 |
| 5,852,320 A | 12/1998 | Ichihashi | 257/419 |
| 5,858,877 A | 1/1999 | Dennison et al. | 438/700 |
| 5,869,893 A | 2/1999 | Koseki et al. | 257/723 |
| 5,930,625 A | 7/1999 | Lin et al. | 438/253 |
| 5,933,758 A | 8/1999 | Jain | 438/687 |
| 5,990,562 A | 11/1999 | Vallett | 257/774 |
| 6,001,538 A | 12/1999 | Chen et al. | 430/316 |
| 6,037,244 A | 3/2000 | Gardner et al. | 438/586 |
| 6,037,248 A | 9/2000 | Ahn | 438/619 |
| 6,143,616 A | 11/2000 | Geusic et al. | |
| 6,187,677 B1 | 2/2001 | Ahn | 438/667 |

OTHER PUBLICATIONS

Makoto Sekine et al., A New High–Density Plasma Etching System Using a Dipole–Ring Magnet, JPN. J. Appl. Phys., Part 1, No. 11, pp. 6274–6278 (Nov. 1995).

Michael E. Thomas et al., VLSI Multilevel Micro–Coaxial Interconnects for High Speed Devices, IEEE, pp. 55–58 (1990).

R. F. Foster et al., High Rate Low–Temperature Selective Tungsten, Materials Research Society, pp. 69–72 (1988).

Abstract: R. J. Gutmann et al., Low and High Dielectric Constant Thin Films for Integrated Circuit Application, Advanced Metallization and Interconnect Systems for VLSI Applications in 1996, 6 pages. p. 393.

Hiroshi Horie et al., Polysilicon–Aluminum Substitute (PAS), Fujitsu Laboratories Limited, 3 pages. Tech. Digest of IEDM Dec. 8–11, 1996 pp. 946–948.

V. Lehmann, The Physics of Macropore in Low Doped n–Type Silicone, 140 J. Electrochem. Soc., No. 10, pp. 2836–2843 (Oct. 1993).

K. P. Muller et al., Trench Storage Node Technology for Gigabit DRAM Generation, IBM Advanced Semiconductor Technology Center, 4 pages. Tech. Digest of IEDM Dec. 8–11, 1996 pp. 507–510.

T. Ohba et al., Evaluation on Selective Deposition of CVD W Films by Measurement of Surface Temperature, Materials Research Society, (1987). pp. 59–66 (Month Unknow).

U.S. application No. 08/917,003, Ahn et al., filed Aug. 20, 1997.

U.S. application No. 09/095,774, Ahn et al., filed Jun. 10, 1998.

U.S. application No. 09/118,346, Geusic et al., filed Jul. 17, 1998.

* cited by examiner

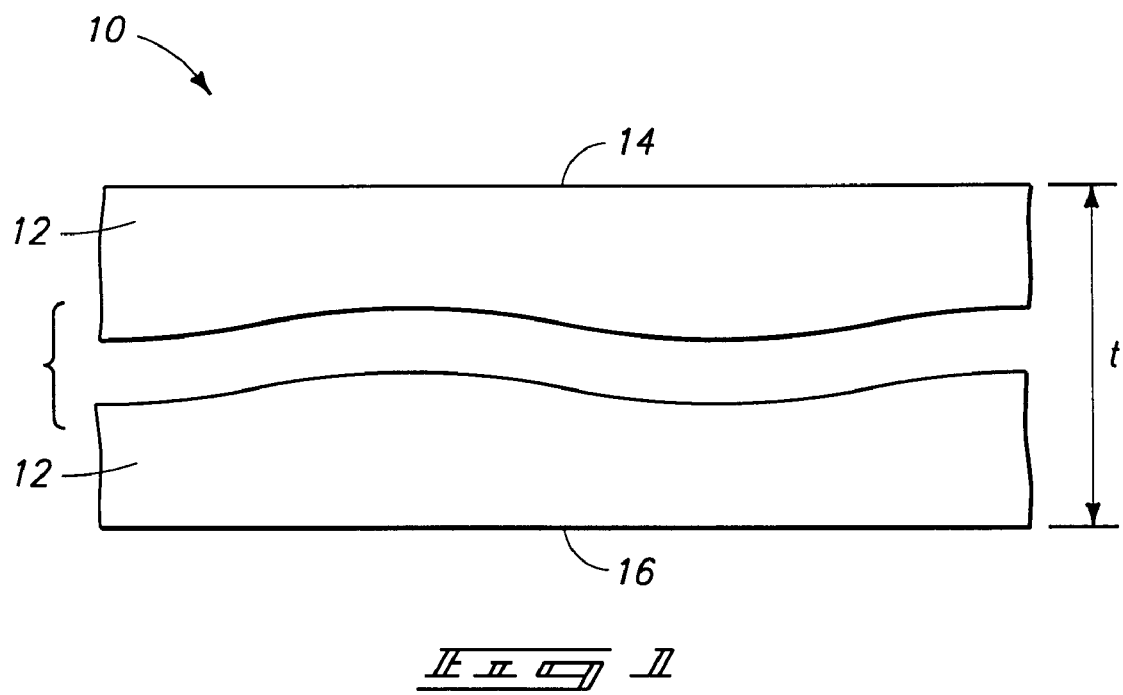
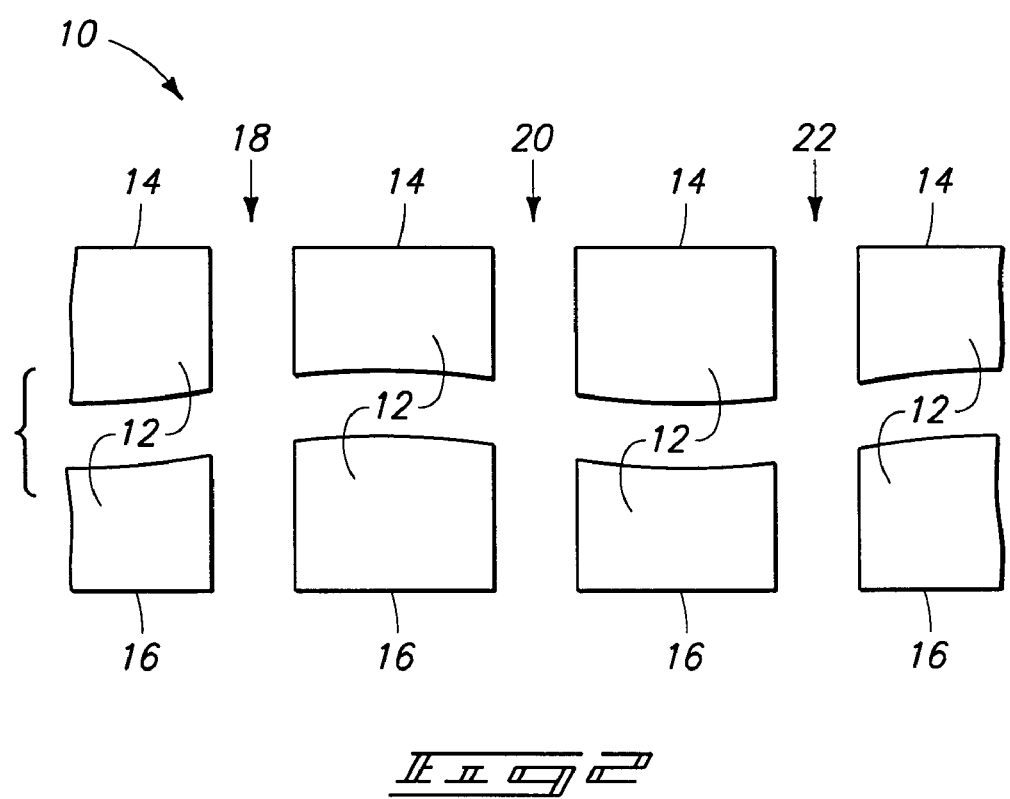

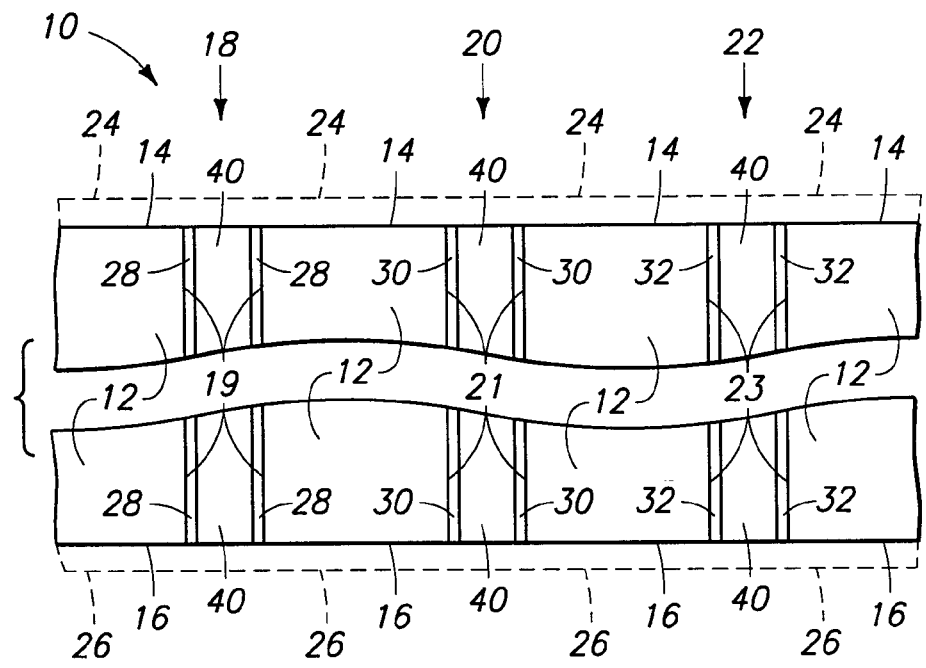
$FIG.\ 7$
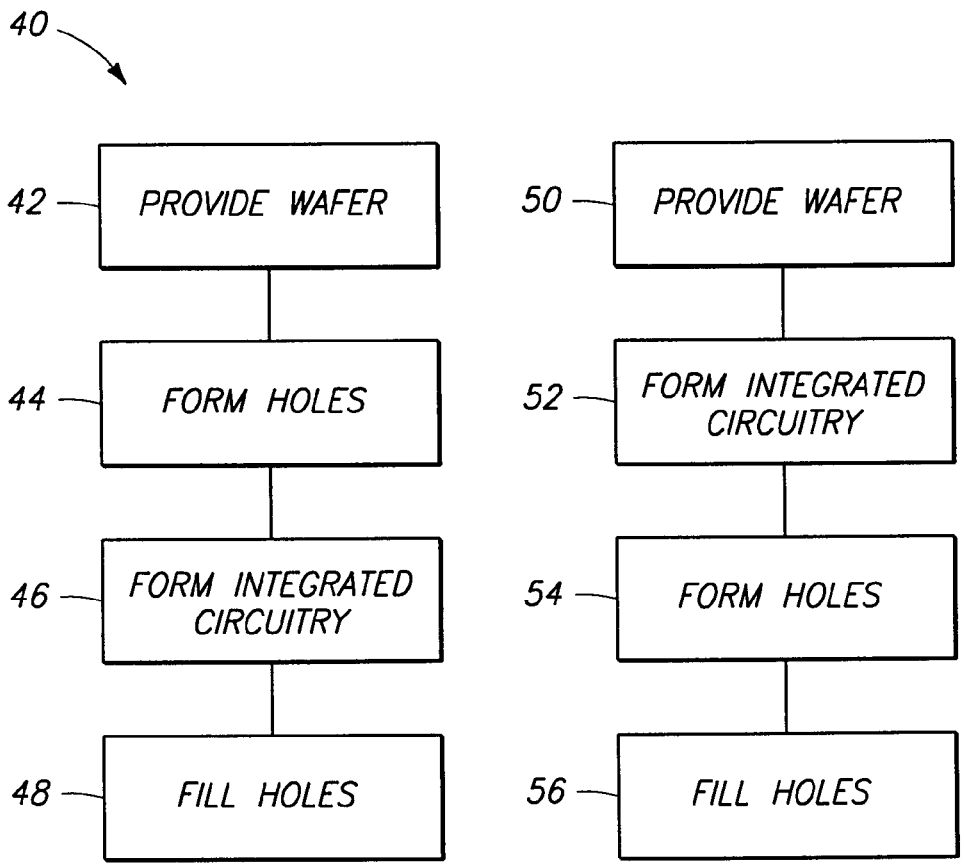
$FIG.\ 8$

INTEGRATED CIRCUITRY HAVING CONDUCTIVE PASSAGEWAY INTERCONNECTING CIRCUITRY ON FRONT AND BACK SURFACES OF A WAFER FRAGMENT

RELATED PATENT DATA

This patent resulted from a divisional application of U.S. patent application Ser. No. 08/917,443, filed Aug. 22, 1997, now U.S. Pat. No. 6,187,677 Feb. 13, 2001 entitled "Integrated Circuitry and Methods of Forming Integrated Circuitry", naming Kie Y. Ahn as inventor, the disclosure of which is incorporated by reference.

TECHNICAL FIELD

This invention relates to integrated circuitry and methods of forming integrated circuitry.

BACKGROUND OF THE INVENTION

As integrated circuitry dimensions shrink, a continuing challenge in the semiconductor industry is to find new, innovative, and efficient ways of forming electrical connections with and between circuit devices which are fabricated on the same and on different wafers or dies. Relatedly, continuing challenges are posed to find and/or improve upon the packaging techniques utilized to package integrated circuitry devices.

This invention arose out of concerns associated with improving the manner in which electrical connections or interconnections are formed relative to integrated circuitry devices.

SUMMARY OF THE INVENTION

Integrated circuitry and methods of forming integrated circuitry are described. In one aspect, a hole is formed in a semiconductor wafer. In a preferred implementation, the hole extends through the entire wafer. Subsequently, conductive material is formed within the hole and interconnects with integrated circuitry which is formed proximate at least one of a front and back wafer surface. According to one aspect of the invention, integrated circuitry is formed proximate both front and back surfaces. In a preferred implementation, a plurality of holes are formed through the wafer prior to formation of the integrated circuitry.

In accordance with a preferred implementation, formation of the conductive material within the hole takes place through formation of a first material within the hole. A second material is formed over the first material, with at least the second material being electrically conductive. The wafer is exposed to conditions which are effective to cause the second material to replace the first material. In another preferred implementation, the hole has an interior surface and prior to formation of the conductive material therein, a dielectric layer is formed within the hole proximate the interior surface.

BRIEF DESCRIPTION OF THE DRAWINGS

Preferred embodiments of the invention are described below with reference to the following accompanying drawings.

FIG. 1 is a cross-sectional view of a semiconductor wafer fragment at one processing step in accordance with the invention.

FIG. 2 is a cross-sectional view of the FIG. 1 semiconductor wafer fragment at a processing step subsequent to that shown by FIG. 1.

FIG. 7 is a cross-sectional view of the FIG. 1 semiconductor wafer fragment at a processing step subsequent to that shown by FIG. 6.

FIG. 8 shows, in flow diagram form, various methodical aspects of the invention.

DETAILED DESCRIPTION OF THE PREFERRED EMBODIMENTS

Figure 3:
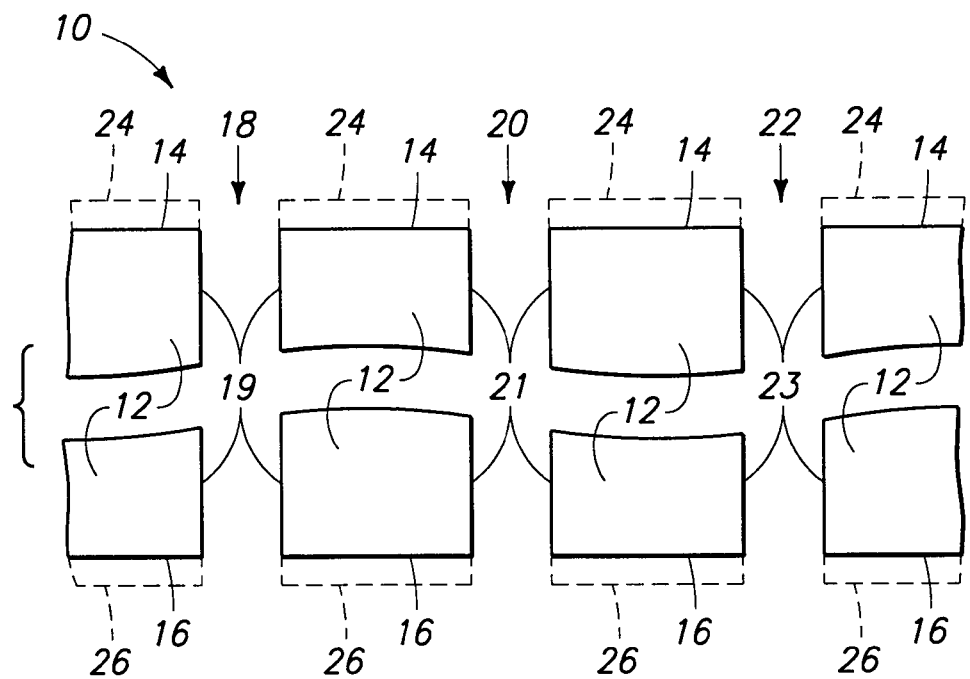
FIG. 3 is a cross-sectional view of the FIG. 1 semiconductor wafer fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment is indicated generally at 10 and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure such as dies and the like, including, but not limited to, the semiconductive substrates described above. Wafer fragment 10 includes a front surface 14 and a back surface 16 and a wafer thickness t which is defined between the surfaces. An exemplary wafer thickness is around 30 mils or between around 750–800 $\mu$m.

Referring to FIG. 2, amounts of semiconductive wafer material are removed to form holes or passageways 18, 20, and 22. In one aspect, such holes are formed to a depth of not less than ½ of thickness t. In a preferred aspect, holes 18, 20, and 22 extend perpendicularly through the entirety of wafer fragment 12 and join with front and back surfaces 14, 16. Preferably, holes 18, 20, and 22 have aspect ratios greater than about 50. Even more preferably, such holes have aspect ratios between about 75 and 80.

In a preferred implementation, holes 18, 20, and 22 are formed or otherwise provided prior to processing of any integrated circuitry devices over either of surfaces 14, 16. That is, prior to patterning any conductive material which is associated with integrated circuitry devices to be formed over either of surfaces 14, 16, holes 18, 20, and 22 are formed. Such holes can be formed through suitable etching techniques. Alternatively, such holes can be formed or drilled with a suitable laser. In a preferred aspect, very high aspect ratio holes are formed by placing the wafer in a semiconductor wafer processor comprising a dipole-ring magnetron etching reactor. Thereafter, wafer 10 is exposed to conditions within the dipole-ring magnetron etching reactor which are sufficient to form holes which extend through the entirety of the wafer. A suitable dipole-ring magnetron (DRM) reactor is described in an article entitled "Trench Storage Node Technology for Gigabit DRAM Generations", Technical Digest of International Electron Devices Meeting, Dec. 8–11, 1996, pps. 507–510, published by IEEE, Catalog No. 96CH35961 and authored by Muller et al. Additionally, a suitable DRM system and exemplary processing conditions are described in an article entitled "A New High-Density Plasma Etching System Using A Dipole-Ring Magnet", Jpn. J. Appl. Phys., Vol. 34, Pt. 1, No. 11, November 1995, pps. 6274–6278, and authored by Sekine et al. After formation of holes 18, 20, and 22, such can be temporarily filled with a material such as photoresist to enable subsequent processing of integrated circuitry devices over either or both of surfaces 14, 16.

Referring to FIG. 3, and in accordance with a preferred implementation, integrated circuitry is formed or otherwise processed and supported by wafer fragment 10. Integrated circuitry 24 can be formed over or proximate front surface 14, back surface 16, or both of front and back surfaces 14, 16, respectively.

Figure 4:
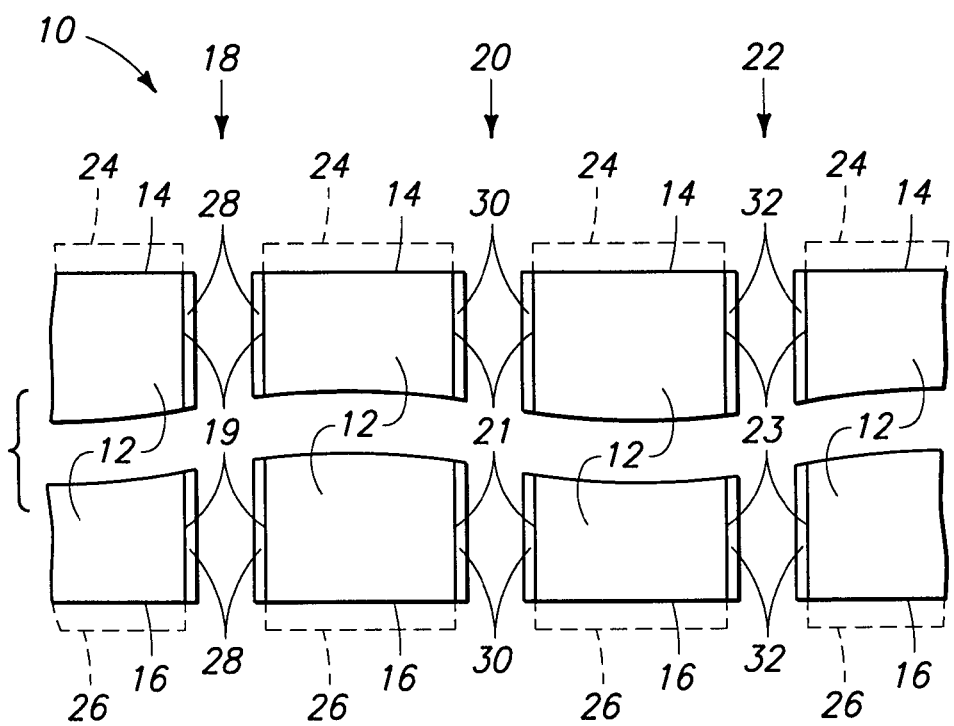
FIG. 4 is a cross-sectional view of the FIG. 1 semiconductor wafer fragment at a processing step subsequent to that shown by FIG. 3.

Referring to FIG. 4, wafer fragment 10 is exposed to conditions which are effective to form respective dielectric layers 28, 30, and 32 within each of holes 18, 20, and 22 and proximate the respective interior surfaces 19, 21, and 23 thereof. In one aspect, dielectric layers 28, 30, and 32 comprise a nitride-containing layer which is disposed proximate respective interior surfaces 19, 21, and 23. An oxide-containing layer is formed over the nitride-containing layer to provide a dielectric NO layer within the hole. In a preferred implementation, a nitride-containing layer is formed through chemical vapor deposition, and the oxide layer by exposing the substrate to oxidizing conditions. In a preferred implementation, dielectric layers 28, 30, and 32 constitute reoxidized LPCVD nitride film which forms the illustrated and preferred NO dielectric layer. An exemplary processing implementation includes in-situ nitridation in ammonia at 950° C. Low pressure chemical vapor deposition of nitride at 700° C. takes place with dichlorosilane and ammonia. Subsequently, reoxidation of the nitride takes place at a temperature of between 900° C. to 950° C. Alternatively, fast thermal processing (FTP) can implement the above-described three processing steps into a single processing run. Exemplary processing methods and systems are described in the Muller et al. article referenced above. Alternatively, dielectric layers 28, 30, and 32 can comprise a thin silicon dioxide film. A desired and exemplary thickness of such layers is between about 50–100 nanometers.

Figure 5:
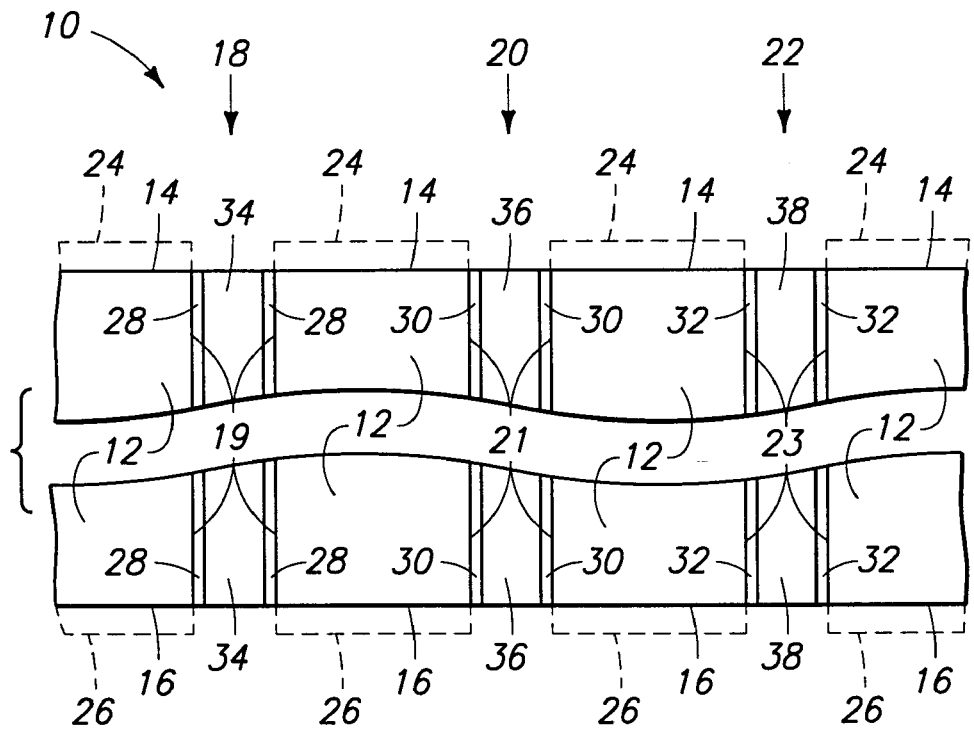
FIG. 5 is a cross-sectional view of the FIG. 1 semiconductor wafer fragment at a processing step subsequent to that shown by FIG. 4.

Referring to FIG. 5, electrical interconnect material 34, 36 and 38 is formed within holes 18, 20, and 22 respectively. Such material preferably fills each hole and is capable of electrically interconnecting integrated circuitry formed over both front and back surfaces 14, 16 respectively. In a preferred implementation, interconnect material 34, 36, and 38 constitutes a first material which is formed within each respective hole and comprises polysilicon which is formed through chemical vapor deposition. Excess first material can be removed through conventional techniques to provide the FIG. 5 construction. Exemplary techniques include planarization and/or various etching techniques.

Figure 6:
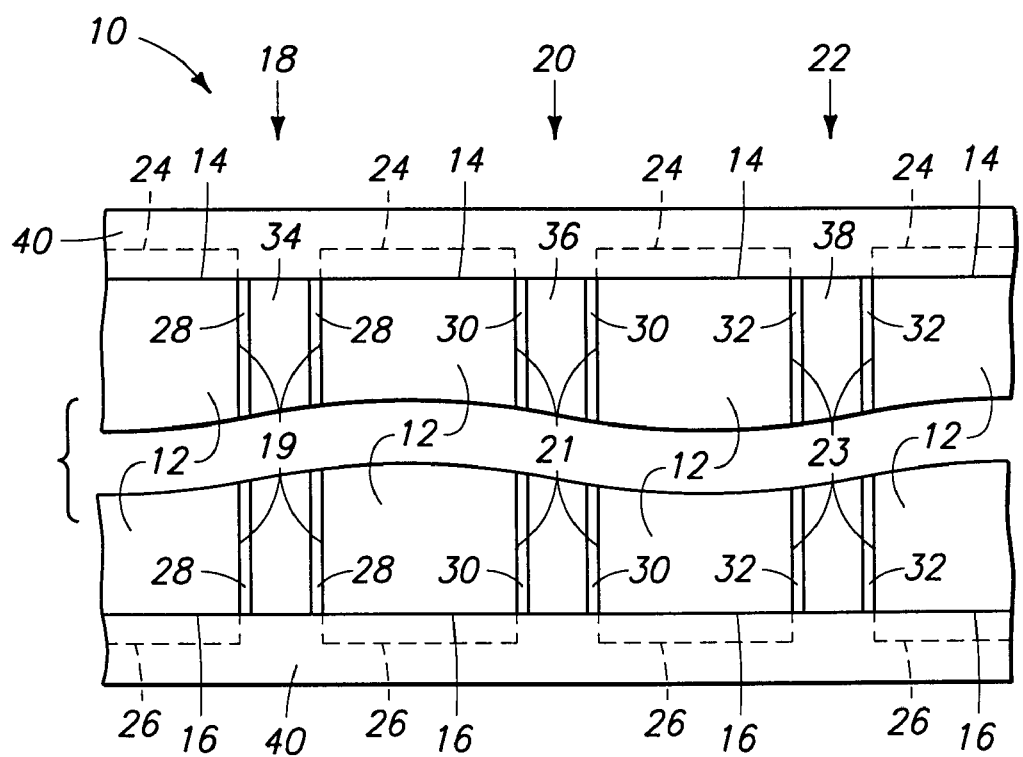
FIG. 6 is a cross-sectional view of the FIG. 1 semiconductor wafer fragment at a processing step subsequent to that shown by FIG. 5.

Referring to FIG. 6, a second layer of electrically conductive material 40 is formed over first material 34, 36, and 38. Preferably, such material is formed over both front and back surfaces 14, 16. In another aspect, second material 40 constitutes a layer comprising a metal material which is different from first material 34, 36, and 38. In a preferred aspect, second material 40 constitutes an aluminum-comprising layer or film. Such material or film can be deposited through suitable sputtering or evaporation techniques. Mechanical masks can be utilized in order to define with more particularity the area over which the preferred aluminum layer is deposited. Alternatively, such layer can be blanket deposited and subsequently processed as described below.

Referring to FIG. 7, wafer fragment 10 is exposed to processing conditions which are effective to cause second material 40 to replace first material 34, 36, and 38 (FIG. 6). Preferably, the first material is completely replaced with the second material and the second material electrically interconnects at least some of the front surface integrated circuitry 24 with at least some back surface integrated circuitry 26. Exemplary processing conditions include annealing the wafer at a temperature greater than or equal to about 500° C. for a sufficient amount of time. The thickness of the second material 40 (FIG. 6) will be determined by the size and dimensions of the interconnecting hole or passageway. As a guideline, and for a 0.175 micron diameter and 1.7 micron deep hole with an aspect ratio of 10, an aluminum thickness of 0.5 microns is sufficient to substitute the preferred polysilicon. Annealing times and temperatures can be decreased by forming a thin, e.g., 0.2 μm, Ti layer over material 40 prior to annealing (not specifically shown). The Ti layer acts as a polysilicon capture layer which accelerates the replacement of polysilicon with aluminum. Exemplary processing methods are described in an article entitled "Novel High Aspect Ratio Plug for Logic/DRAM LSIs Using Polysilicon-Aluminum Substitute (PAS)", Technical Digest of International Electron Devices Meeting, Dec. 8–11, 1996, pps. 946–8, published by IEEE, Catalog No. 96CH35961 and authored by Horie et al. Excess aluminum and the substituted-for polysilicon can be removed through suitable processing techniques such as chemical mechanical polishing.

Alternately considered, a conductive interconnect is provided within wafer fragment 10 between and electrically connecting at least a portion of the front-formed integrated circuitry and the back-formed integrated circuitry. In the illustrated example, the integrated circuitry is formed in advance of the formation of the conductive interconnect.

Referring to FIG. 8, certain methodical aspects of the invention are shown at 40 in the form of a flow diagram. A semiconductor wafer is provided at 42, and holes are formed at 44, preferably in a manner described above. Following formation of the holes at 44, integrated circuitry is formed at 46 over the wafer. After formation of the integrated circuitry, the holes are filled at 48 with electrically conductive interconnect material which interconnects with the integrated circuitry.

In another implementation, a wafer is provided at 50, and integrated circuitry is formed at 52. After formation of the integrated circuitry, holes are formed in accordance with the above-described methodology. Thereafter, such holes are filled with conductive interconnect material in a manner which interconnects with the integrated circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising:

a semiconductive wafer fragment having front and back surfaces;

integrated circuitry disposed over both the front and back surfaces;

at least one passageway extending entirely through the wafer fragment between the front and back surfaces, the passageway being defined by an interior surface comprising material of the wafer fragment, the passageway extending into the wafer fragment in a direction which is generally normal relative to the front and back surfaces and defining a pair of opposing parallel sidewalls extending between the front and back surfaces, the passageway having an aspect ratio of between 75 and 80, the passageway being lined with an electrically insulating material, the electrically insulating material comprising a silicon nitride layer in physical contact with material of the wafer fragment within the passageway, the electrically insulating material comprising a silicon dioxide layer over and in physical contact with the silicon nitride layer, the silicon nitride layer and the silicon dioxide layer having a combined thickness of from 50 nanometers to 100 nanometers; and conductive material comprising conductive aluminum disposed within the at least one passageway and in physical contact with the silicon dioxide layer, the conductive aluminum electrically interconnecting the integrated circuitry disposed over the front and back surfaces, the passageway not containing any semiconductive wafer fragment material.

2. The integrated circuitry of claim 1 wherein the semiconductive wafer fragment has a thickness of 30 mils.

3. The integrated circuitry of claim 1 wherein the semiconductive wafer fragment has a thickness of from 750 microns to 800 microns.

4. The integrated circuitry of claim 1 wherein the passageway has a diameter of 0.175 micron.

* * * * *